(12) United States Patent
Green et al.

(10) Patent No.: US 11,899,082 B2
(45) Date of Patent: Feb. 13, 2024

(54) SILICON HALL SENSOR WITH LOW OFFSET AND DRIFT COMPENSATION COILS

(71) Applicant: TEXAS INSTRUMENTS INCORPORATED, Dallas, TX (US)

(72) Inventors: Keith Ryan Green, Prosper, TX (US); Tony Ray Larson, Tucson, AZ (US)

(73) Assignee: Texas Instruments Incorporated, Dallas, TX (US)

( * ) Notice: Subject to any disclaimer, the term of this patent is extended or adjusted under 35 U.S.C. 154(b) by 269 days.

(21) Appl. No.: 17/015,327

(22) Filed: Sep. 9, 2020

(65) Prior Publication Data
US 2022/0075009 A1   Mar. 10, 2022

(51) Int. Cl.
| | |
|---|---|
| *G01R 33/07* | (2006.01) |
| *H10N 52/80* | (2023.01) |
| *H10N 52/00* | (2023.01) |
| *H10N 52/01* | (2023.01) |

(52) U.S. Cl.
CPC ......... *G01R 33/072* (2013.01); *H10N 52/101* (2023.02); *H10N 52/80* (2023.02); *H10N 52/01* (2023.02)

(58) Field of Classification Search
CPC .... G01R 33/07; G01R 33/072; G01R 33/077; H01L 43/065; H01L 43/14; H10N 52/101; H10N 52/01; H10N 52/80
See application file for complete search history.

(56) References Cited

U.S. PATENT DOCUMENTS

| | | | | |
|---|---|---|---|---|
| 2007/0290682 | A1* | 12/2007 | Oohira | G01R 33/075 257/E43.003 |
| 2010/0134101 | A1* | 6/2010 | Riva | G01R 33/07 324/251 |
| 2011/0210722 | A1* | 9/2011 | Paci | G01R 33/04 29/25.01 |
| 2017/0288131 | A1* | 10/2017 | Sun | H01L 43/14 |
| 2020/0333203 | A1* | 10/2020 | Cadugan | G01L 9/10 |
| 2020/0371168 | A1* | 11/2020 | Van Der Wiel | G01R 33/0011 |

FOREIGN PATENT DOCUMENTS

JP   2004279325 A   * 10/2004   ............ G01P 3/487

OTHER PUBLICATIONS

English translation JP2004279325-A.*

* cited by examiner

*Primary Examiner* — Latanya N Crawford Eason
(74) *Attorney, Agent, or Firm* — Andrew R. Ralston; Frank D. Cimino

(57) ABSTRACT

An integrated circuit includes a doped region having a first conductivity type formed in a semiconductor substrate having a second conductivity type. A dielectric layer is located between the doped region and a surface plane of the semiconductor substrate, and a polysilicon layer is located over the dielectric layer. First, second, third and fourth terminals are connected to the doped region, the first and third terminals defining a conductive path through the doped region and the second and fourth terminals defining a second conductive path through the doped region, the second path intersecting the first path.

25 Claims, 14 Drawing Sheets

SILICON HALL SENSOR WITH LOW OFFSET AND DRIFT COMPENSATION COILS

CROSS REFERENCE TO RELATED APPLICATIONS

This application is related to U.S. application Ser. No. 16/xxx,xxx ("the 'xxx Application") filed on even date herewith, which is incorporated herein by reference in its entirety. This Application is related to U.S. application Ser. No. 16/576,963 ("the '963 Application") and to U.S. application Ser. No. 16/888,927, each of which is incorporated herein by reference in its entirety.

FIELD

This disclosure relates to the field of semiconductor devices, and more particularly, but not exclusively, to magnetic sensors, e.g. Hall-effect sensors.

BACKGROUND

Hall-effect sensors, sometimes referred to as Hall sensors, may be implemented as dedicated devices or integrated with other circuitry to provide measurement of magnetic fields for control purposes. Some such example applications may measure angular displacement of a permanent magnet, or measure current flow in a path of interest.

SUMMARY

The inventors disclose various methods and devices that may be beneficially applied to Hall-effect sensors and systems. While such embodiments may be expected to provide improvements in performance of such applications, no particular result is a requirement of the present invention unless explicitly recited in a particular claim.

One example is an integrated circuit that includes a doped region having a first conductivity type formed in a semiconductor substrate having a second conductivity type. A dielectric layer is located between the doped region and a surface plane of the semiconductor substrate, and a polysilicon layer is located over the dielectric layer. First, second, third and fourth terminals are connected to the doped region, the first and third terminals defining a conductive path through the doped region and the second and fourth terminals defining a second conductive path through the doped region, the second path intersecting the first path.

Another example is a Hall sensor that includes a first Hall sensor including a first doped region having a first conductivity type formed in a semiconductor substrate having a second conductivity type, and a second Hall sensor including a second doped region having the first conductivity type formed in the semiconductor substrate. A first coil is located over the first doped region in an interconnect level, and a second coil is located over the second doped region in the interconnect level. The first coil is configured to produce in response to a current a first magnetic moment with a first direction, and the second coil is configured to produce in response to the current a second magnetic moment with a second direction opposite the first direction.

DETAILED DESCRIPTION

Figure 1A:
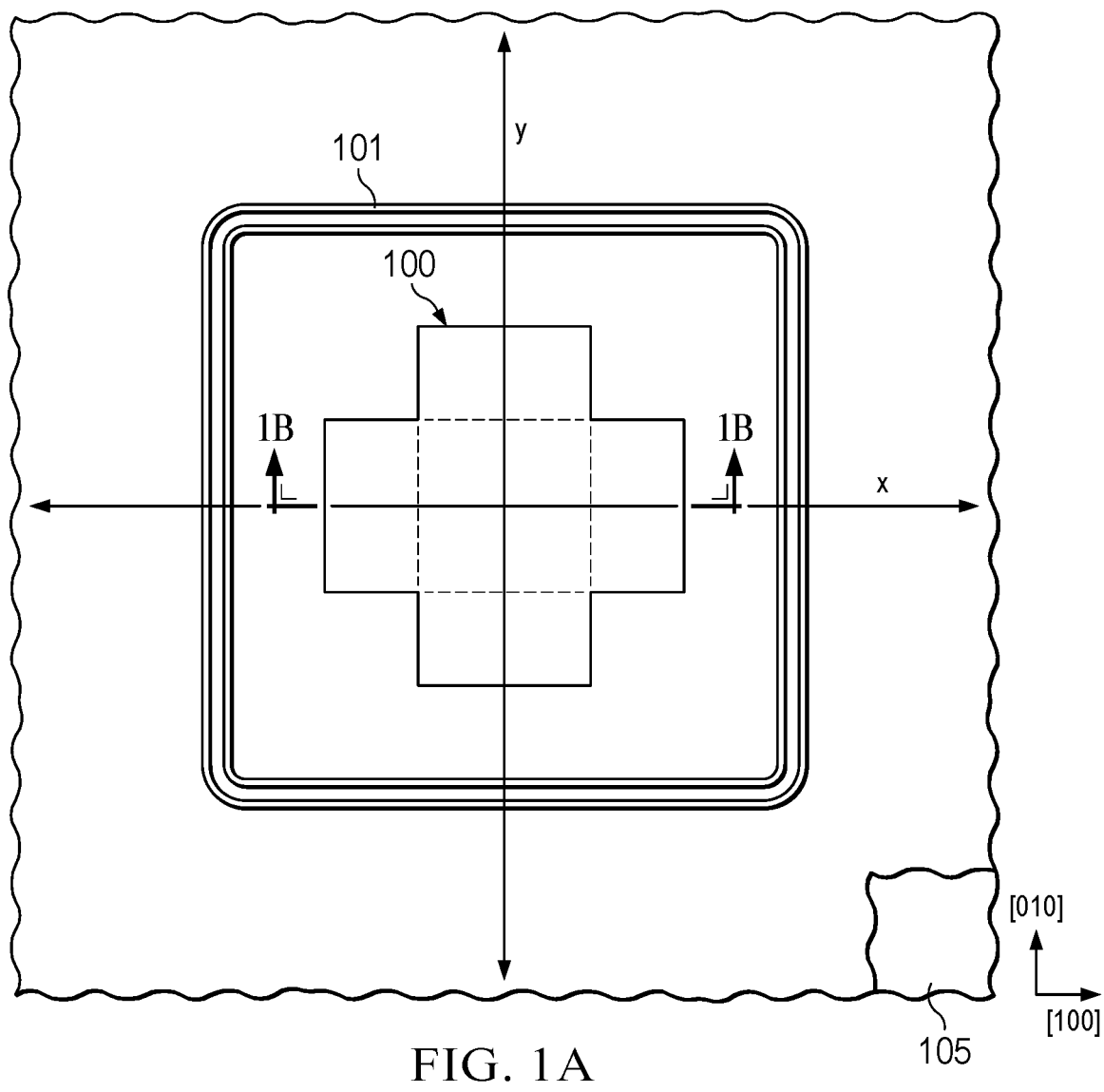
FIGS. 1A-1F illustrate aspects of a Hall-effect sensor in one implementation of the disclosure, including coils formed in metal interconnect levels, and a polysilicon shield between the coils and a Hall well.

The present disclosure is described with reference to the attached figures. The figures are not necessarily drawn to scale, and they are provided without implied limitation to illustrate various described examples. Several aspects of the disclosure are described below with reference to example applications for illustration. It should be understood that numerous specific details, relationships, and methods are set forth to provide an understanding of the disclosure. The present disclosure is not limited by the illustrated ordering of acts or events unless stated otherwise, as some acts may occur in different orders and/or concurrently with other acts or events. Furthermore, all illustrated acts or events may not be required to implement a methodology in accordance with the present disclosure.

This application discloses various methods and devices that may be beneficially applied to manufacturing Hall sensors and sensing systems that may improve precision of magnetic field measurements made using such sensors. While such embodiments may be expected to provide improvements in performance of these sensors and systems, no particular result is a requirement of the described invention(s) unless explicitly recited in a particular claim.

The performance of Hall-effect sensors may be influenced by effects that reduce the accuracy and/or precision of the sensor. Intrinsic effects may include offset and manufacturing variation. Variable affects may include changes of resistance due to changes of temperature, current bias, mechanical stress and/or age.

Examples consistent with the present disclosure may reduce measurement offset in several ways. First, a Hall sensor may be oriented such that current flow during operation is oriented along variants of a [100] direction of a crystal lattice in which the sensor is formed. Such crystallographic directions may include, e.g. [100], [010] and [001] directions. Second, the Hall well may be capped with a dielectric layer formed from a shallow trench isolation (STI) process. Third, the Hall well may be doped with a sufficient concentration of dopant to reduce both the contribution to offset made by the surrounding p-n junctions and magnitude of flicker noise associated with the STI cap without substantially reducing Hall sensitivity. The STI cap may also increase the usable bandwidth of the sensor relative to implementations in which the Hall well is capped with a p-type layer. Fourth, compensating coils located over the Hall sensor may be used to compensate for systematic bias that may be constant or changing over time. Finally, but not exclusively, a polysilicon layer is used over the Hall well. Without limitation by theory, the presence of the polysilicon layer is thought to reduce flicker noise and aging drift of offset voltage. The polysilicon layer also electrostatically shields the Hall sensor from metal coils above it that are sometimes used for compensating temperature, stress and aging drifts.

In some examples multiple, e.g. four, Hall sensors are configured in a single sensing unit. When four Hall sensors are used, the sensors may be connected as two pairs, sometimes referred to as a "dual-dual" configuration. Each of two signal channels includes a pair (dual) of Hall sensors, where each of two signal channels includes one of the pairs. For each pair, a first sensor may be operated in parallel with a second sensor, with the signal connections of the second sensor connected at locations rotated 90° relative to the connections to the first sensor. Such a configuration may further reduce offset of a magnetic field strength computed from the sensed voltages of the four Hall sensors in the dual-dual configuration. A detected signal, generated by a nearby current or magnetic field, is common to both pairs. Each sensor has its own compensation coil over it, and the four coils are connected in series to reduce the total required current. Coils are wound clockwise for one dual and counter-clockwise for the other dual. Current through the coils may be used to generate a reference signal that is used to adjust the current bias through the Hall sensors, and therefore their magnetic gain, to compensate for drift and or/offset that may develop over the life of the sensors. Each dual may also be electrically rotated using spinning/chopping circuitry to further reduce the offset. Additional details are described in the co-pending application 16/xxx,xxx. For general background, see A. Bilotti, G. Monreal and R. Vig, "Monolithic magnetic Hall sensor using dynamic quadrature offset cancellation," in IEEE Journal of Solid-State Circuits, vol. 32, no. 6, pp. 829-836, June 1997, doi: 10.1109/4.585275, and V. Mosser, N. Matringe and Y. Haddab, "A Spinning Current Circuit for Hall Measurements Down to the Nanotesla Range," in IEEE Transactions on Instrumentation and Measurement, vol. 66, no. 4, pp. 637-650, April 2017, doi: 10.1109/TIM.2017.2649858, each of which is incorporated herein by reference in its entirety.

FIG. 1A illustrates an example of a single Hall sensor 100 in schematic form. The Hall sensor 100 is representative of multiple instances of Hall sensors that may be implemented in various examples herein. An isolation structure 101, e.g. including doped deep trenches and/or deep dielectric structures, optionally and possibly preferably, surrounds the Hall sensor 100 to provide isolation from neighboring Hall sensors and other circuit elements on a same substrate. The Hall sensor 100 has a "plus" or "cross" configuration. As used herein, either of these terms refers to a dodecagon, having 12 sides and 12 angles between sides, for which all angles are 90°. Eight of the angles, referred to as "interior angles" are 90° when viewed from the interior of the dodecagon, and four angles, "exterior angles", are 270° when viewed from the interior. A core portion of the Hall sensor 100 is defined as that portion enclosed by a quadrilateral that connects the four exterior angles. Four arm portions are those portions of the Hall sensor outside the core portion. An x-axis intersects the midpoint of the sides of two opposite arms, and a y-axis orthogonal to the x-axis intersects the midpoint of the sides of the other two opposite arms. Generally, when current is caused to flow between opposite arms, the current flows parallel to the x-axis or the y-axis. In the presence of a magnetic field the current flow between the two arms may create a voltage potential between the other opposite arms as mobile carriers are deflected by the magnetic field.

The Hall sensor 100 is located over a semiconductor substrate 105, described in greater detail below. The substrate 105 has crystallographic axes parallel to the substrate surface, including a [100] axis and a [010] axis. Such a substrate may be a so-called {100} silicon wafer. The Hall sensor 100 is preferably oriented such that the x-axis is aligned with, or parallel to, the [100] crystallographic axis, and the y-axis is aligned with, or parallel to, the [010] crystallographic axis. Thus the current flow between the arms will be parallel to one of the [100] or [010] axis.

Figure 1B:
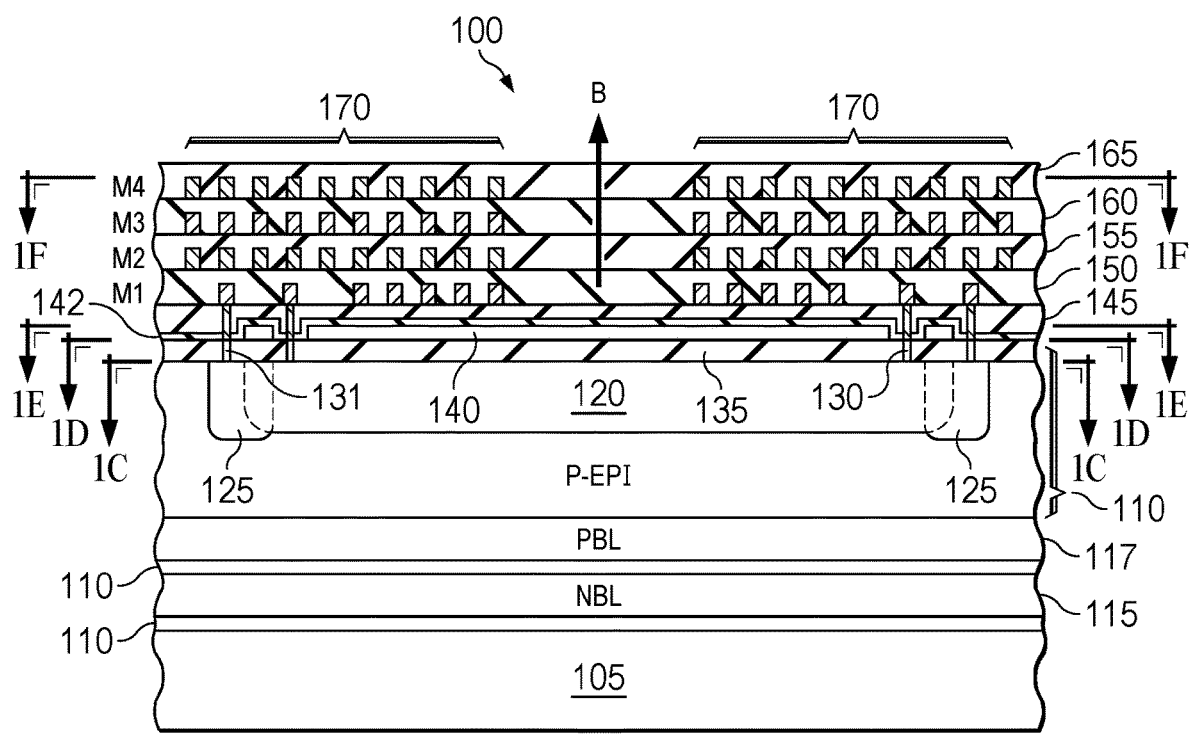

FIG. 1B illustrates the Hall sensor 100 in greater detail in sectional view without implied limitation thereto. An epitaxial layer 110 is located over the semiconductor substrate 105, and may be P-type silicon lightly doped with boron to about $2E15$ cm$^{-3}$. A buried layer 115 is formed within the epitaxial layer 110, and may also be N-type doped with arsenic to a concentration of about $7E18$ cm$^{-3}$. A buried layer 117 is formed above the buried layer 115, and may be P-type doped with boron to a concentration of about $1E17$ cm$^{-3}$. A dielectric layer 135 extends from the surface of the epitaxial layer 110 toward the buried layer substrate 105. The dielectric layer 135 may be a shallow trench oxide (STI) layer, and is referred to as such hereafter without implied limitation. In one example the thickness of the dielectric layer 135 is about 400 nm, and in some implementations about 385 nm.

An N-type region 120 extends from the STI layer 135 toward the substrate 105, and may be doped with phosphorous or arsenic to a concentration of about $3E16$ cm$^{-3}$. The N-type region 120, which may be referred to a Hall well 120, may be formed by a process used to form an N-drift region of an extended drain MOS transistor elsewhere over the substrate 105. A P-type region 125 also extends from the STI layer 135 toward the buried layer 115, and may be doped with boron to about $6E16$ cm$^{-3}$. The P-type region 125 may be referred to generally as a P-well, and may overlap the Hall well 120 as shown, and form a continuous well structure that follows the perimeter of the Hall well 120. The P-well 125 may be biased during operation to provide lateral junction isolation of the N-type Hall well 120 from the P-type epitaxial layer 110. Heavily doped contacts 130, 131 respectively provide conductive paths through the STI layer 135 to the Hall well 120 and the P-well 125. Note that an analogous Hall sensor within the scope of the disclosure may be formed with the described N-type regions replaced by P-type regions, and the described P-type regions replaced by N-type regions.

Figure 1C:
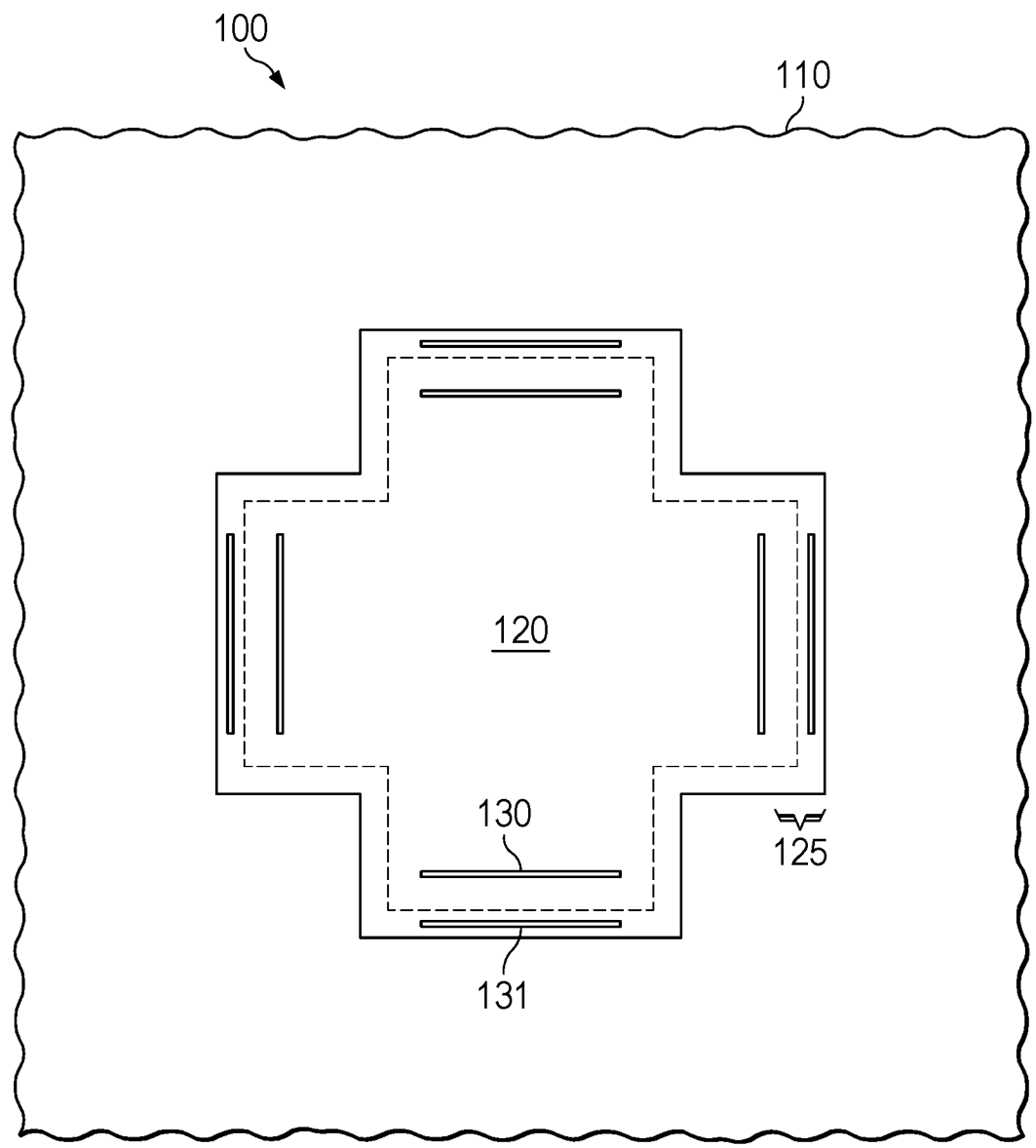

Viewing FIG. 1C, a plan view is shown at the level of the Hall well 120 and the P-well 125. The lateral extents of the Hall well 120 take the form of a cross, as previously described, including four arms. The P-well 125 overlaps the Hall well 120 around the perimeter of the Hall well 120, with the overlapping region depicted by a dashed border. Four instances of the heavily doped contact 130 are shown according to one example as a rectangular region at the end of each arm. Four instances of the heavily doped contact 131 are shown according to one example as a rectangular region past the end of each arm, over the corresponding P-well 125. Alternatively, the contacts 130 and 131 may be implemented as a linear array of discrete circular contacts.

Returning to FIG. 1B, a polysilicon layer 140 is located over the STI layer 135. The polysilicon layer 140 may be formed from a same material layer used to form gate electrodes for MOS transistors elsewhere over the substrate 105. Optionally, and possibly preferably, the polysilicon layer 140 is connected to a ground rail of a circuit in which the sensor 100 is configured to operate. A dielectric layer 142, e.g. silicon nitride, conformally covers the polysilicon layer 140. The dielectric layer 142 may be a silicide block layer that is used to prevent silicide formation on selected areas of a circuit of which the sensor 100 is a part, as well as preventing silicide formation on the polysilicon layer 140.

The polysilicon layer 140 includes openings that allow metal contacts to conductively connect to the heavily doped contacts 130. A dielectric layer 145, e.g. a phosphorous-doped silicon oxide poly-metal dielectric (PMD) layer, covers the polysilicon layer 140.

Figure 1D:
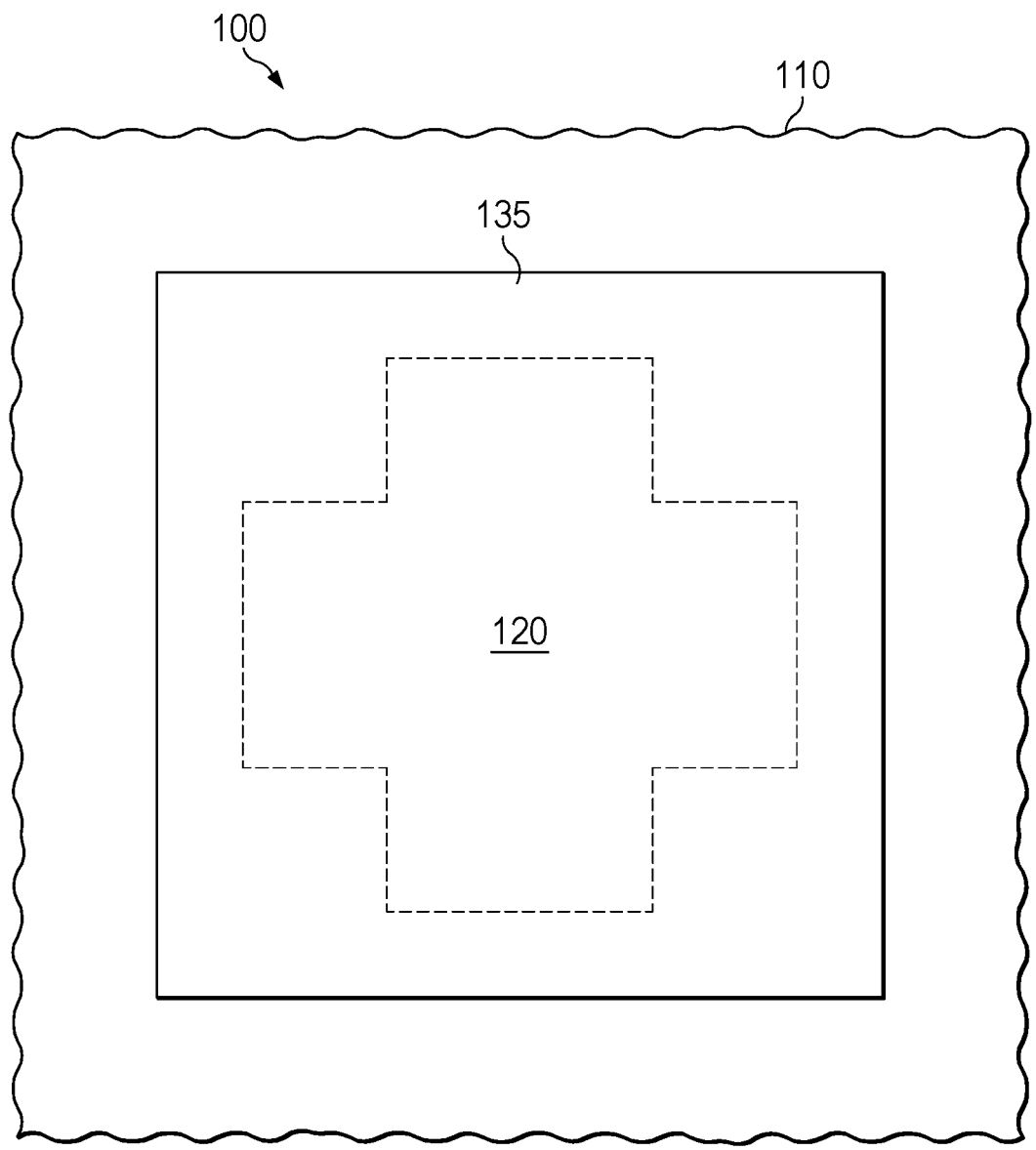

FIG. 1D shows a plan view of the STI layer 135 and an outline of the Hall well 120 for reference. Shallow trench isolation features are typically formed by etching a trench in a semiconductor substrate, growing a thermal oxide layer and then filling the remaining portion of the trench with plasma oxide. Oxide outside the trench is removed by chemical mechanical polishing (CMP), leaving the desired STI trench surrounded by the semiconductor surface. Thus the surfaces of the epitaxial layer 110 and the surface of the STI layer 135 define a plane. For the purpose of the discussion and the claims the term "surface plane of the substrate", and variations thereof, refer to this plane.

Figure 1E:
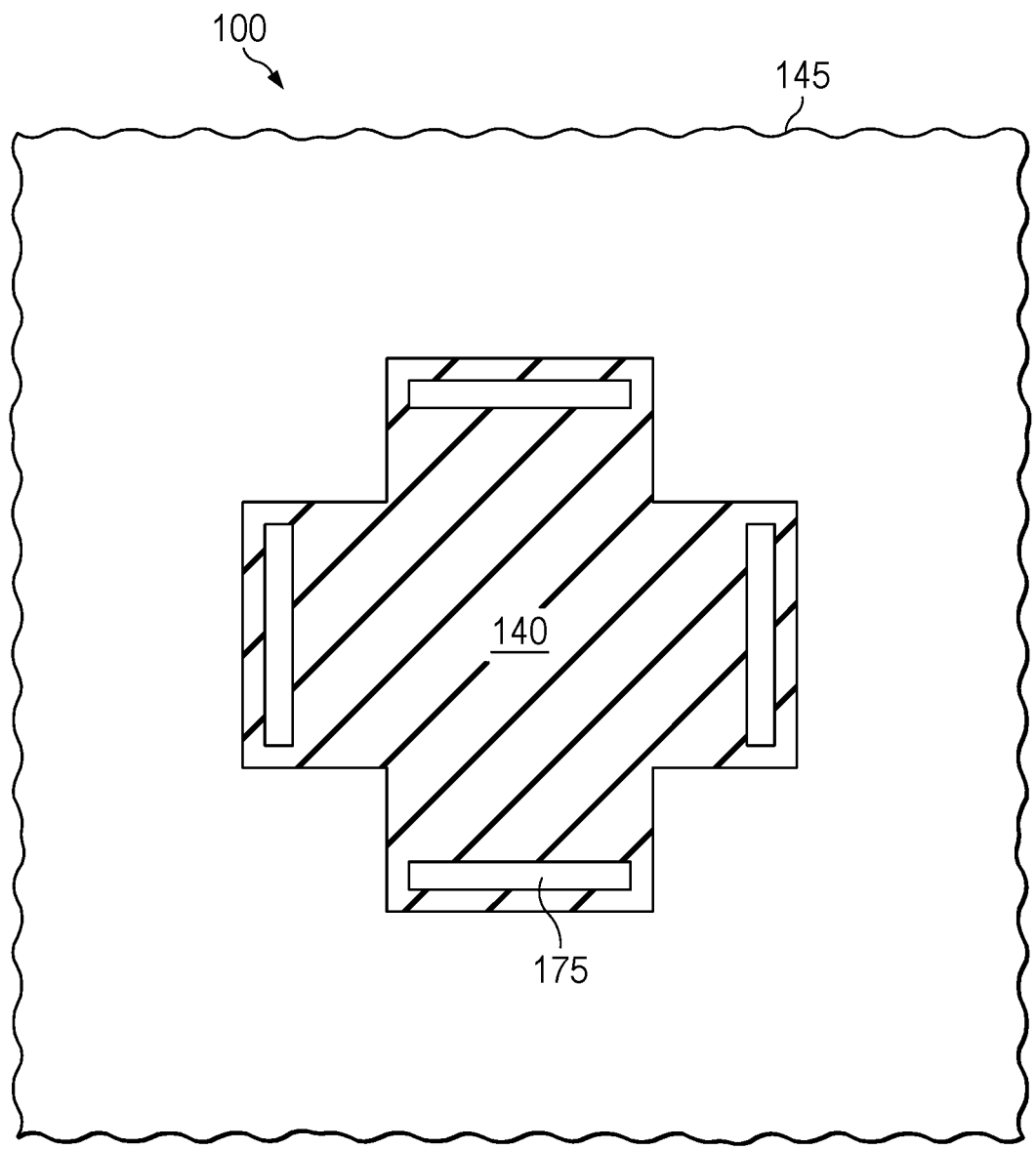

FIG. 1E shows a plan view of the polysilicon layer 140 surrounded by the dielectric layer 145, at the level of the polysilicon layer 140. The polysilicon layer 140 also has a cross form, and may have the same or nearly the same lateral extent as the Hall well 120. One instance of an opening 175 is located near the end of each arm of the polysilicon layer 140 to allow a corresponding metal via to electrically contact each corresponding contact 130.

Returning again to FIG. 1B, four interconnect levels M1, M2, M3 and M4 are shown over the dielectric layer 145. Each interconnect level M1 . . . M4 includes a corresponding one of dielectric layers 150, 155, 160 and 165, and metal interconnect features that form a coil 170. When a current is passed through the coil 170 a magnetic moment is formed that generally has a component normal to the surface plane of the substrate 105. Typically the magnetic moment will be normal to the surface plane, or nearly so. As described below the coil 170 may be used to monitor performance of the Hall sensor 100, and compensate for inaccuracies such as offset and drift of a measured Hall voltage. The M1 interconnect level also includes metal features connected to each of the contacts 130 and 131. The contacts 131 are biased during operation to maintain the junction isolation of the Hall well 120. The contacts 130 are used to either direct a current from one arm of the Hall well 120 to the opposite arm, or are used to measure a Hall voltage between the opposite arms of the Hall well 120.

Figure 1F:
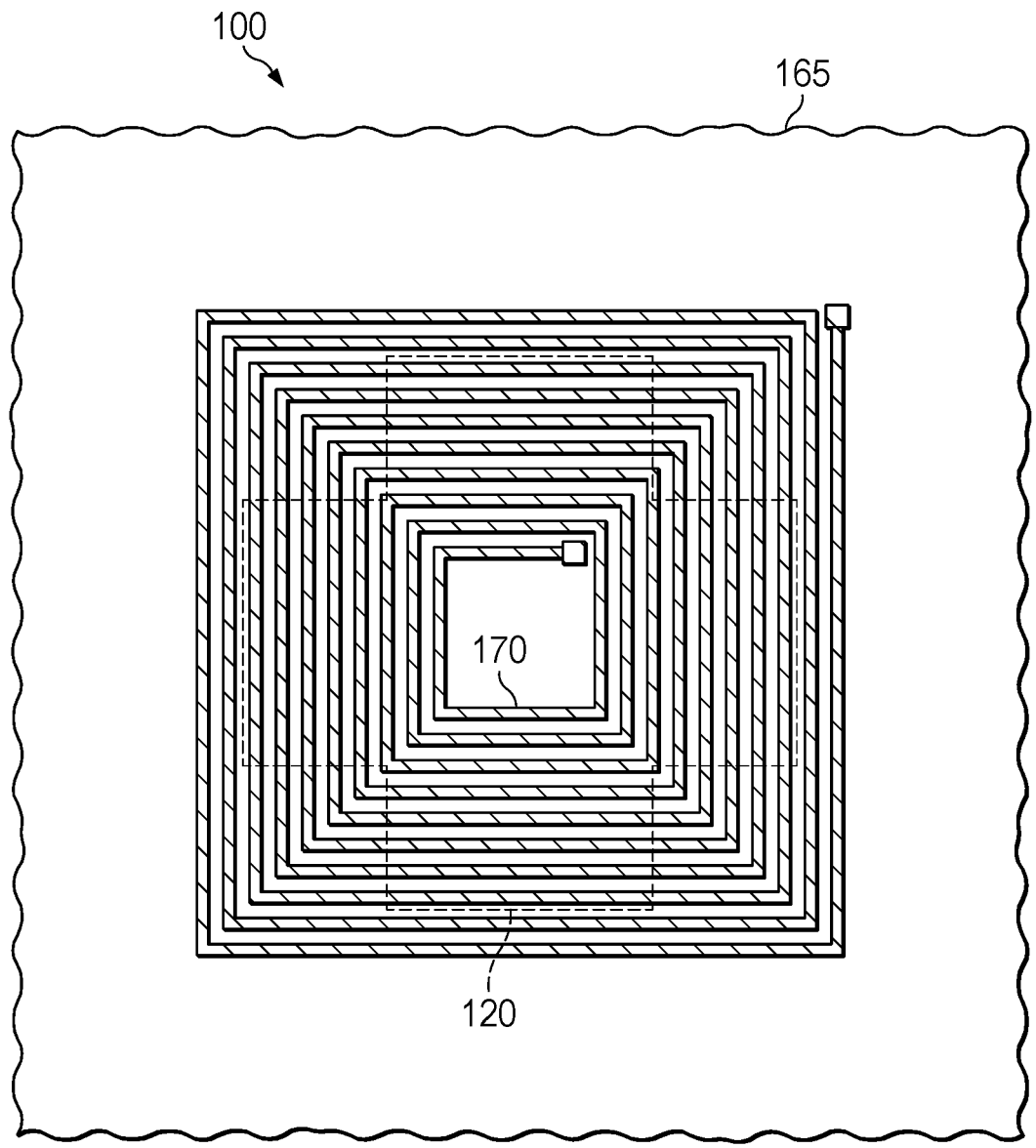

FIG. 1F illustrates a plan view of a metal spiral 180 at the M4 interconnect level of FIG. 1B, and includes an outline of the Hall well 120. In the present example metal segments form a spiral that extends to the ends of the arms of the Hall well 120, shown for reference by dashed lines. The metal features at the M1, M2 and M3 interconnect levels define similar spiral structures that are connected to form the coil 170 from the metal spirals 180 in a manner such that current in all the spirals is conducted in a same clockwise (CVV) or counterclockwise (CCW) orientation. Examples consistent with the disclosure are not limited to any particular number of metal levels. In another example, the metal spiral at the M1 level has a smaller number of turns than metal spirals at higher metal levels, e.g. to accommodate the interconnects that connect to the contacts 130 and 131. In some examples, the spiral at the M1 level may be omitted.

Figure 2A:
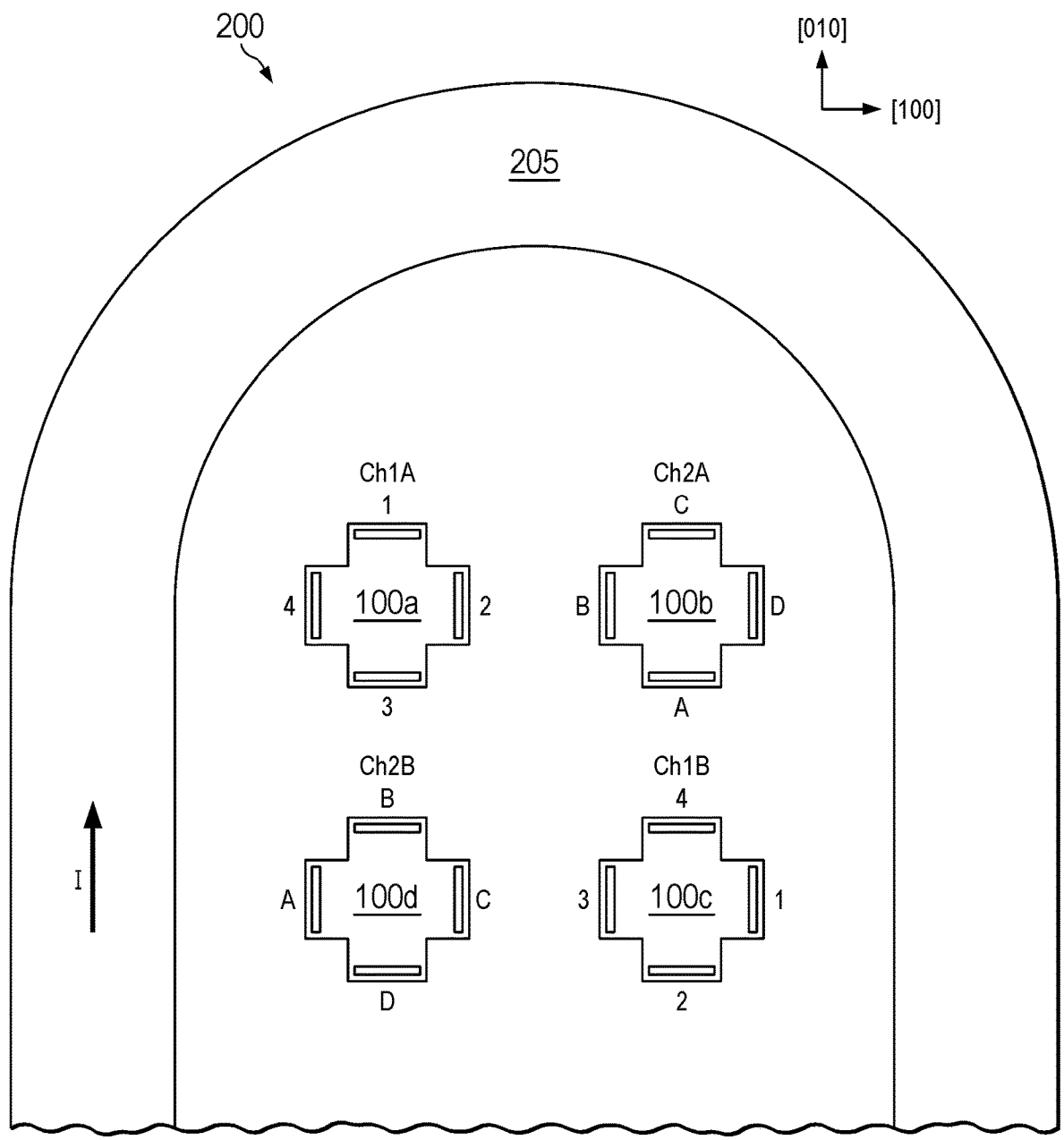
FIGS. 2A-2D illustrate aspects of a Hall-effect measurement system including four Hall-effect sensors arranged in a 2×2 array, e.g. a "dual-dual" configuration.

FIG. 2A shows a sensor system 200 including four instances of the Hall sensor 100 in a 2×2 array without implied limitation. The isolation structure 101 is omitted for clarity. A first channel Ch1 includes Hall sensors 100a and 100c, each of which may be an instance of the Hall sensor 100. A second channel Ch2 includes Hall sensors 100b and 100d, each of which may also be an instance of the Hall sensor 100. For discussion purposes, the terminals of the sensors 100a and 100c are designated 1-4, and the terminals of the sensors 100b and 100d are designated A-D. Optionally, but possibly preferably, each of the sensors 100a . . . 100d is oriented such that current flow from one terminal to an opposite terminal, e.g. terminal 1 to terminal 3, or terminal A to terminal C, is oriented parallel to the [100] or [010] crystallographic directions of the underlying semiconductor substrate. In one optional and possibly preferred configuration, as illustrated, the sensors 100 of each channel are arranged diagonally, which may improve matching between the channels by reducing the effect of manufacturing variation. In another optional configuration as illustrated, a current bus 205 is placed adjacent the sensors 100a . . . 100d, e.g. in a device package that includes the sensor system 200. The current bus 205 is representative of numerous possible configurations that generate magnetic field lines with a component orthogonal to the substrate 105. Current flowing in the bus 205 will produce a local magnetic field proportional to the magnitude of the current flow. Charge carriers in the Hall sensors 100a . . . 100d will be subjected to the Lorenz force resulting from the local magnetic field, creating a bias perpendicular to the direction of current flow. This bias is detected at each sensor 100a . . . 100d as the Hall voltage. The sensors 100a . . . 100d may thus be used to monitor this magnetic field as an indirect measure of the current flow. The bus 205 may be at a same or a different metal level as the coil 170, and may be external to the device die on which the sensors 100a . . . 100d are formed, such as within a package in which the device die is contained. In other implementations the bus 205 may be omitted, and the system 200 used to detect magnetic fields produced more remotely from the system 200.

Figure 2B:
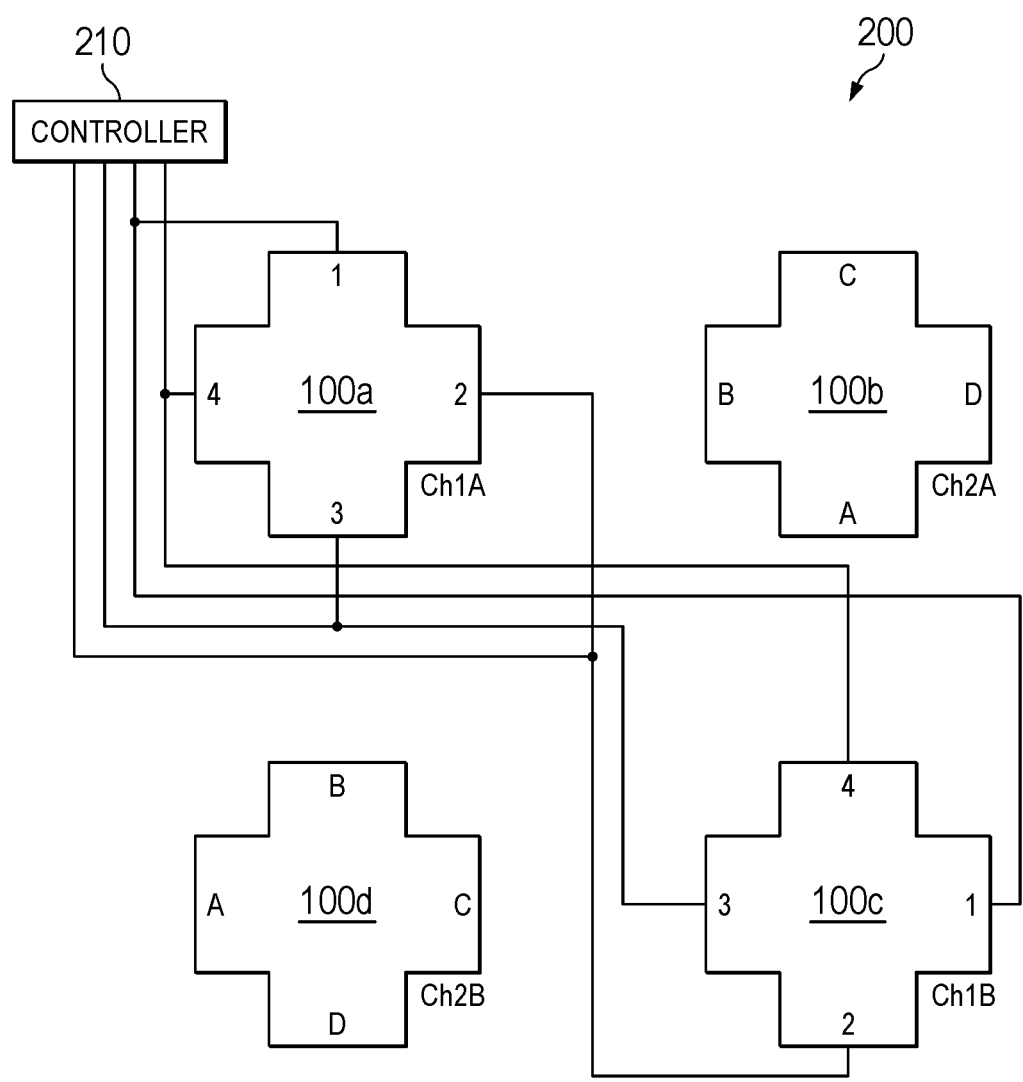
Figure 2C:
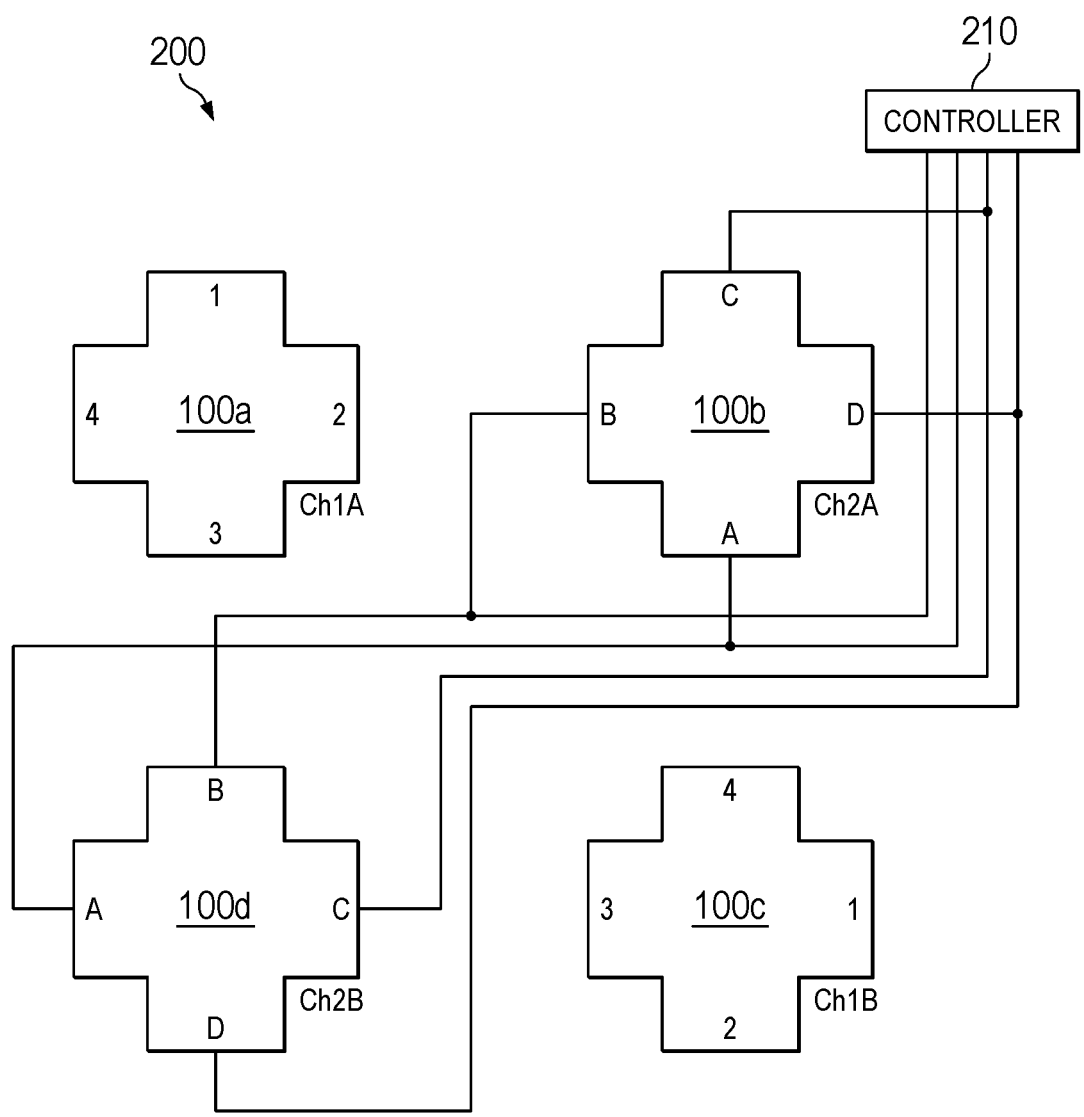

FIGS. 2B and 2C illustrate the sensor system 200, e.g. implemented as an integrated circuit. Example conductive connections are shown from a control circuit 210 to the terminals of the sensors 100a-100d. Operation of the control circuit is described briefly in this disclosure, while additional details may be found in the '963 application. For clarity of presentation FIG. 2B shows connections to only the sensors 100a and 100c, e.g. the first channel, and FIG. 2C shows connections to only the sensors 100b and 100d e.g. the second channel. The control circuit 210 includes necessary components to direct an excitation current between an opposite pair of terminals of each of the Hall sensors 100a . . . 100d, and to determine the voltage across selected terminals of each of the Hall sensors 100a . . . 100d. The control circuit 210 may include, e.g. op-amps, resistors, capacitors, transistors, memory, and or a state machine configured to perform the described functions.

The sensors 100a and 100c may be electrically connected in parallel, in that the excitation signal is divided between each of these sensors. Optionally, but possibly preferably, the sensor 100c is electrically "rotated" relative to the sensor 100a, such that the excitation current component through the sensor 100c is in a direction orthogonal to the excitation current component through the sensor 100a. The sensors 100b and 100d may be similarly configured to operate in parallel, with the sensor 100d electrically rotated with respect to the sensor 100b. In a further optional but possibly preferable, configuration, the excitation current through each of the sensors 100a . . . 100d is directed in a unique direction, e.g. orthogonal or antiparallel with respect to the other sensors. Such an arrangement may be advantageous in some circumstances, e.g. to substantially cancel biases resulting from physical homogeneities in the media in which the Hall sensors 100a . . . 100d are implemented.

In one example a measurement cycle of a Hall sensor 100 includes four phases in which the current through the Hall sensor 100 has a different direction in each phase. In various examples the order in which current is directed between terminals of the sensors 100a . . . 100d is rotated 90° from one phase to the next phase, wherein the current is directed to terminals that progress in clockwise (CW) fashion or counterclockwise (CCW) fashion. In an optional but possibly preferable implementation the sensors of one channel, e.g. sensors 100a and 100c, are rotated in one direction, e.g. CW, and the sensors of the other channel, e.g. 100b and 100d, are rotated in the opposite direction, e.g. CCW. In each phase the current is directed to each terminal of sensors 100a . . . 100d one time, and a Hall voltage measured for sensor at each phase, with the results averaged to produce a single value. Additional details are described in the 'xxx application.

The accuracy of the measurement obtained by the measurement system 200 may be adversely affected by various factors. In one example, fixed charges or dangling bonds at or near the top surface of the Hall well 120 (FIG. 1B) may cause an offset of the measured value relative to a desired "true" value of the ambient magnetic field. In another example, manufacturing variation may result in offsets between Hall voltages produced by nominally identical sensors. Such effects may be partially or substantially reduced by certain structural features of the Hall sensor 100, and by operating the coil 170 of each of the sensors 100 in the manner described below.

Regarding such structural features, first the polysilicon layer 140 is considered. The inventors believe that fixed charges, e.g. charge traps such as dangling bonds, may form between the dielectric layer 142 and the STI layer 135. Such charges are unpredictable, so may differ between multiple Hall sensors on the same substrate, leading to different resistance, magnetic sensitivity and offsets, and therefore mismatch between the sensors. The polysilicon layer 140 spaces the dielectric layer 142 away from the Hall well 120, preventing such charge traps between the dielectric layer 142 and the STI layer 135, thereby reducing the effect of such charges on sensor performance. Second, the inventors believe that capacitive coupling between the coil 170 and the Hall well 120 may modulate the performance of the sensor 100 as current flows through the coil 170. The STI layer 135 spaces the Hall well 120 from the M1 level of the coil 170, to reduce the coupling between these structures, and some affects that result from such coupling. Also, the polysilicon layer 140 may at least partially shield the Hall well 120 from electric fields produced by the coil 170.

Figure 2D:
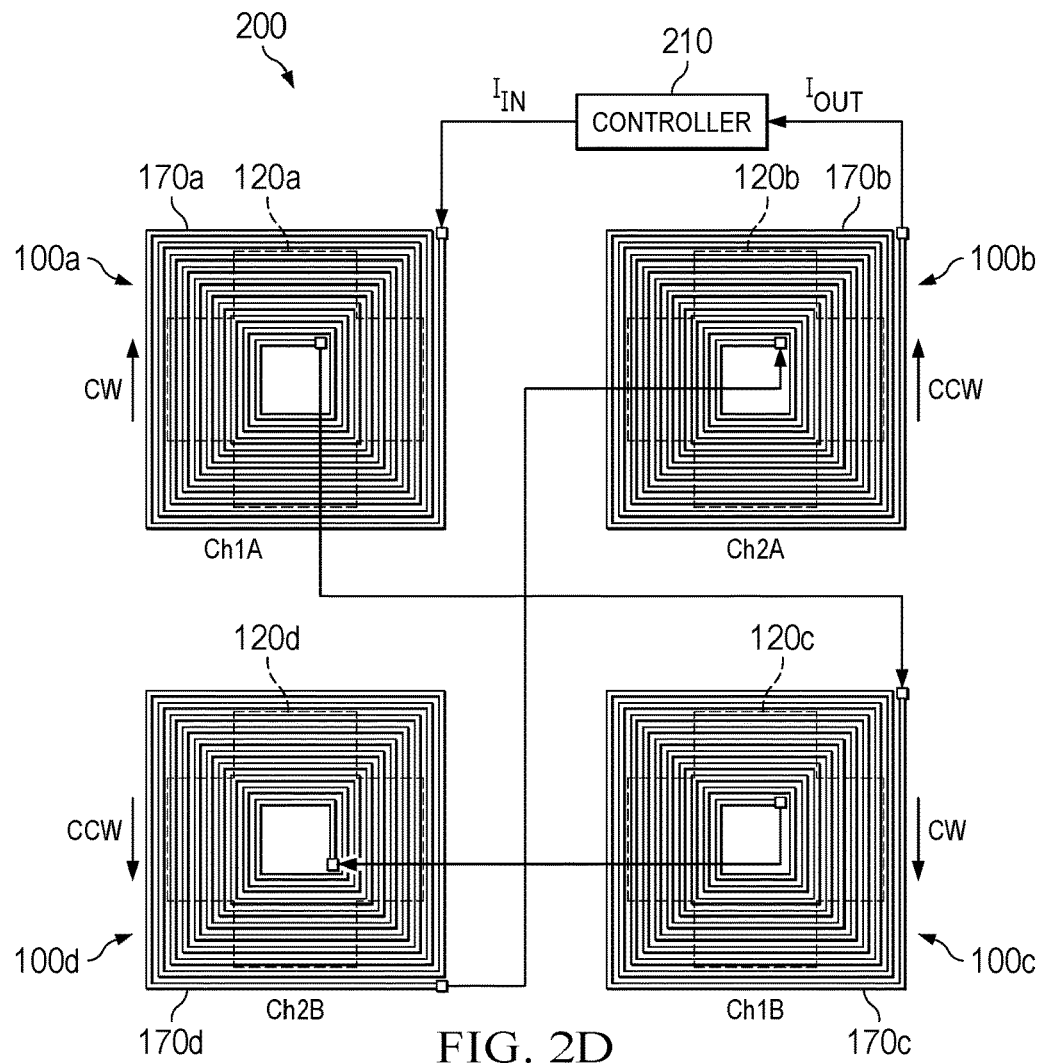

FIG. 2D illustrates the Hall sensor system 200 in schematic form in which the four instances of the sensor 100 are represented by an outline of the Hall well 120 designated 120a, . . . 120d. Over each Hall well 120 is shown a coil 170, the four instances designated 170a . . . 170d. As was shown in FIG. 1B, each coil 170 may include multiple metal levels, but the coils 170a . . . 170d are each illustrated for simplicity using a single metal level. The coils 170 are illustrated without implied limitation with each turn having a smaller "radius" following the coil path in a CW direction.

The control circuit 210 sources a current $I_{in}$ to one of the coils 170, e.g. 170a. In one example the current is a 1 kHz square wave modulated between −1 mA and +1 mA, though other frequencies, and minimum and maximum magnitudes, are possible. The current enters the coil 170a at the outermost turn and thus the current flows CW to the innermost turn, thereby producing a magnetic moment oriented into the plane of the figure (right-hand rule). When the coil 170a is implemented using multiple metal levels, the multiple levels may be connected such that the current at each level of the CH1A sensor flows CW, and progresses through the levels in order from the top metal level to the bottom metal level, or the reverse. Thus, for example, if the current enters the coil 170a at a top metal level, the current may progress through the multiple levels and exit at a bottom metal level. For simplicity the current is illustrated as entering the CH1A coil 170a at an outermost turn, and exiting that coil 170 at an innermost turn. The current is then directed by appropriate interconnections to the coil 170c associated with CH1B. Optionally, and possibly preferably, the current exits the coil 170c at the same metal level the current enters the coil 170d.

The coil 170c is also configured to receive the current at the outermost turn, and output the current at an innermost turn, the current flowing CW through the coil 170c. As was described for the coil 170a, the current may flow through multiple metal levels from top to bottom or vice-versa. Thus the magnetic moment produced by the coil 170c is also oriented into the plane of the figure. The innermost turn is then connected by appropriate interconnections to the innermost turn of the coil 170d.

The current in the coil 170d flows CCW from the innermost turn to the outermost turn, again understanding multiple metal levels may be included. Thus the magnetic moment produced is oriented out of the plane of the figure. The outermost turn of the coil 170d is connected by appropriate interconnections to the innermost coil of the coil 170b, optionally and possibly preferably at a same metal level. The current flows CCW from the innermost turn to the outermost turn, again producing a magnetic moment oriented out of the plane of the figure. The current then returns to the control circuit 210. In another example, not shown, the control circuit 210 may output two currents, one for ChA and the other for ChB, with the currents configured to produce a magnetic moment in the ChA sensors that is opposite a magnetic moment produced by the ChB sensors.

As described in the 'xxx application, a Hall voltage measured from each of Ch1A, Ch1B, Ch2A and Ch2B may be summed and normalized to produce a measure of the local magnetic field. In this case because the magnetic moments produced by the coils 170a and 170c are oppositely oriented from the magnetic moments produced by the coils 170b and 170d, the effect of these magnetic moments on the measured Hall voltages cancel out. The remaining signal is representative of the local magnetic field. On the other hand, if the Hall voltages produced by Ch2 Hall sensors 100b and 100d are subtracted from those produced by Ch1 Hall sensors 100a and 100c, the effect of the local ambient magnetic field is cancelled, leaving the sum of the effects of the current through the coils 170a . . . 170d. The control circuit 210 may adjust the excitation current of the Hall Sensors 100a . . . 100d to result in a computed voltage equal to a reference value that may be determined and stored when the system 200 is placed into service. Thus any effects of bias or drift in the sensors 100a . . . 100d may be nulled during operation of the system 200, substantially reducing the effect of sensor drift. Additional details may be found in the '963 application.

Figure 3:
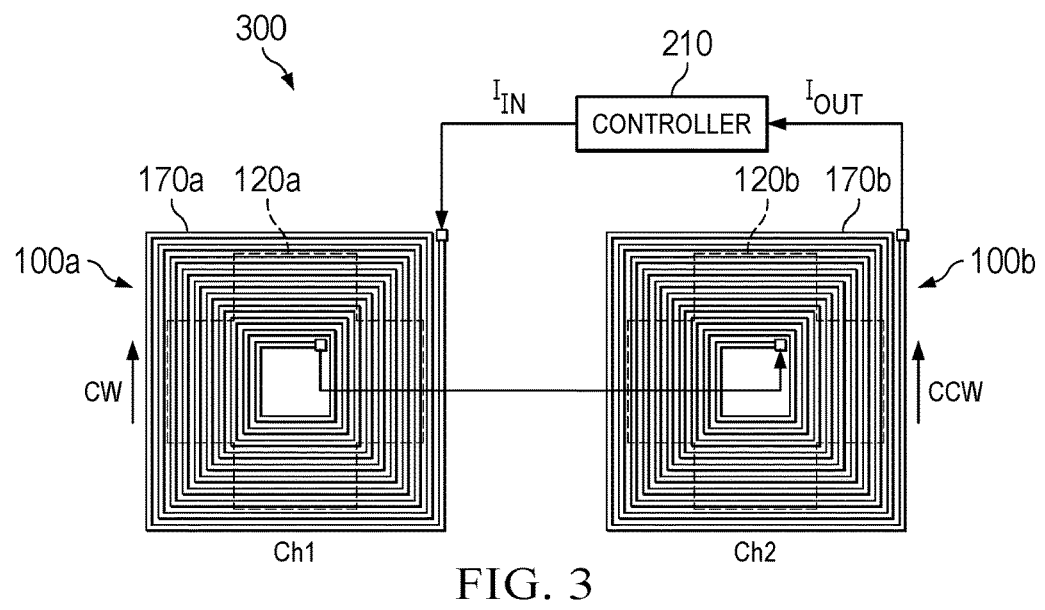
FIG. 3 illustrates aspects of a Hall-effect measurement system including two Hall-effect sensors, e.g. a "single-dual" configuration.

While the system 200 is shown having four Hall sensors in the dual-dual configuration, the described principles may be applied to system using fewer or more than two Hall sensors 100 per channel. FIG. 3 illustrates an example system 300 includes a single Hall sensor 100 in each of two channels, referred to a single-dual configuration. Only Hall sensors 100a, 100b having coils 170a, 170b and Hall wells 120a, 120b are shown for illustration. The control circuit 210 is shown again, but may omit redundant functionality and circuitry otherwise needed to accommodate more than two Hall sensors. The control circuit 210 directs $I_{in}$ to the coil 170a such that a CW current flows through the coil 170a, and a magnetic moment is produced with a direction component directed into the plane of the figure. When the current exits the coil 170a, it is directed to the coil 170b such that a CCW current flows through the coil 170b, and a magnetic moment is produced with a direction component directed out of the plane of the figure. As described previously, a measurement cycle may include four phases. At the completion of the cycle the Hall voltages may be re-summed and re-differenced as described previously. The principle may be extended to systems including four or more Hall sensors per channel, though there may be diminishing returns of increased measurement precision for the additional die area consumed.

Turning to FIGS. 4A-4G, an instance of the Hall sensor 100 according to the disclosure is shown in various stages of manufacturing in a representative example. The description of these intermediate stages may refer to P-type and N-type features. An analogous process sequence may be implemented in which the conductivity types of these features are reversed.

Figure 4A:
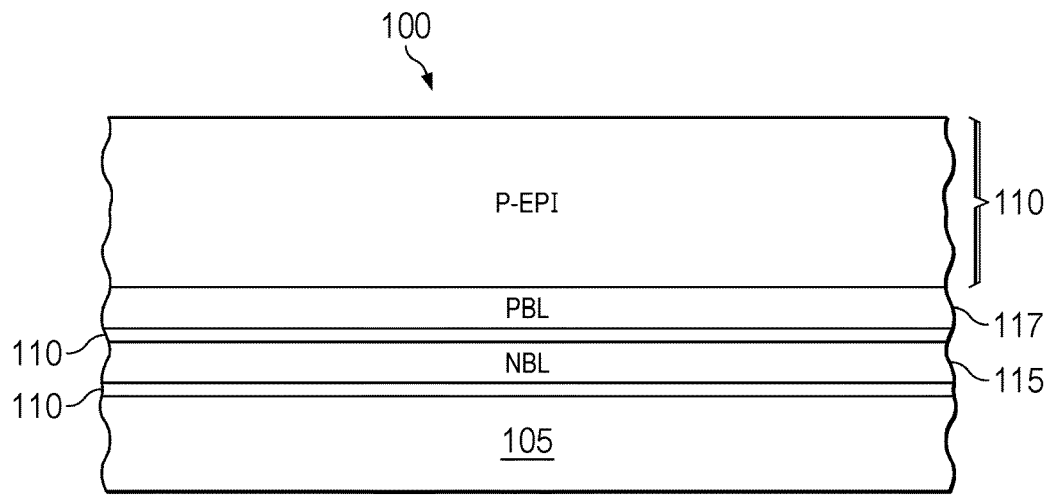
FIGS. 4A-4F illustrate a Hall-effect sensor such as that shown in FIG. 1B at various progressive stages of manufacturing.
Figure 4B:
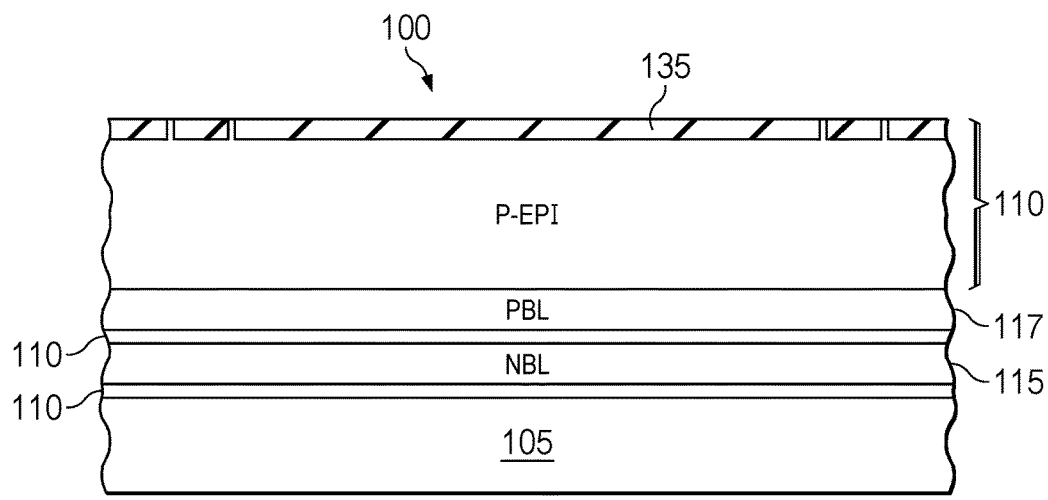
Figure 4C:
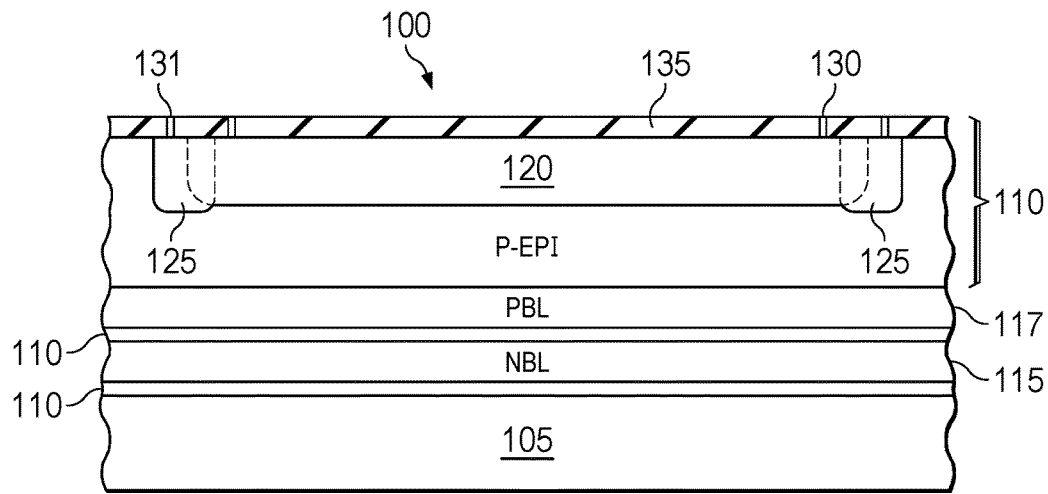

In an initial intermediate stage, FIG. 4A shows the Hall sensor 100 after the lightly-doped P-type epitaxial layer 110 has been formed over the substrate 105, and the N-type buried layer and P-type buried layer 117 have been formed within the epitaxial layer 110. In FIG. 4B the STI layer has been formed over or within the epitaxial layer 110. Unreferenced openings in the epitaxial layer 110 will become the contacts 130, 131 at a later stage of manufacturing. In FIG. 4C the N-type Hall well 120 and the P-well 125 have been formed, e.g. by respective selective implants. For the Hall well 120, an N-type dopant such as phosphorous may be implanted with a chain implant, e.g. using three implant conditions: 2.3E12 cm$^{-2}$ @ 600 keV, plus 8.0E11 cm$^{-2}$ @ 230 keV, plus 6.5E11 cm$^{-2}$ @ 55 keV. This implant protocol may result in a depth of about 2 μm for the Hall well 120, with a decreasing N-type concentration with depth. For the P-well 125 a P-type dopant such as boron may be implanted with a chain implant, e.g. using three implant conditions: 1.7E12 cm$^{-2}$ @ 20 keV, plus 1.2E13 cm$^{-2}$ 170 keV, plus 1.3E13 cm$^{-2}$ @ 500 keV. Those skilled in the pertinent art will appreciate that other implant conditions may be used to produce suitable doped regions. The heavily doped contacts 130 and 131 have also been formed by respective N-type and P-type implants.

Figure 4D:
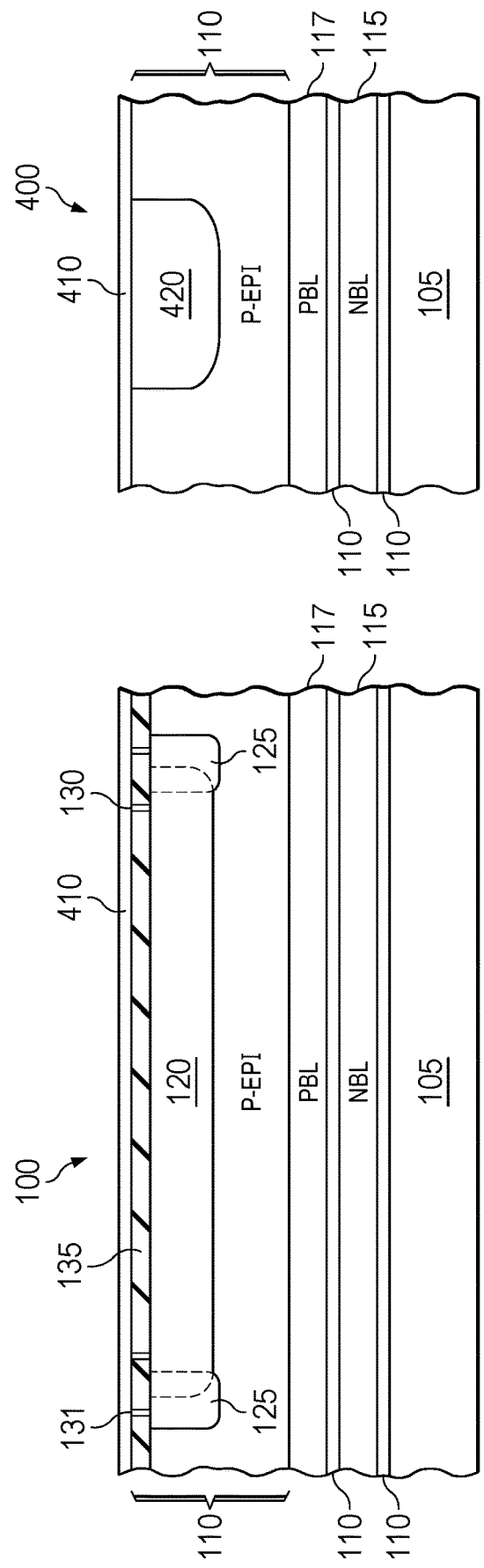
Figure 4E:
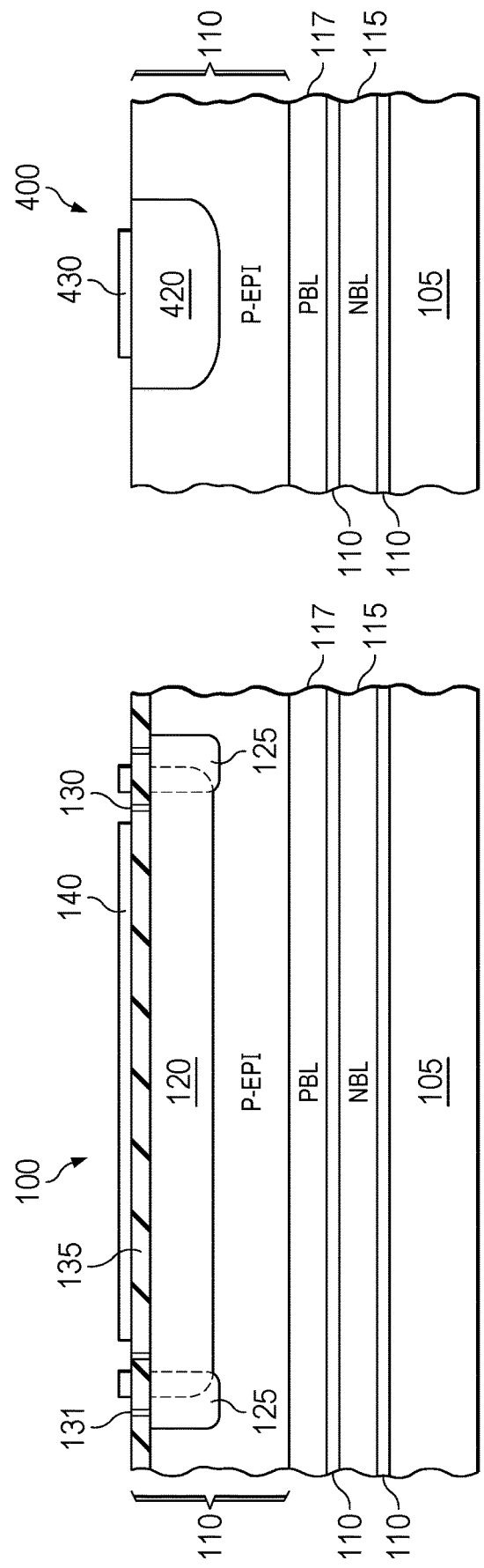
Figure 4F:
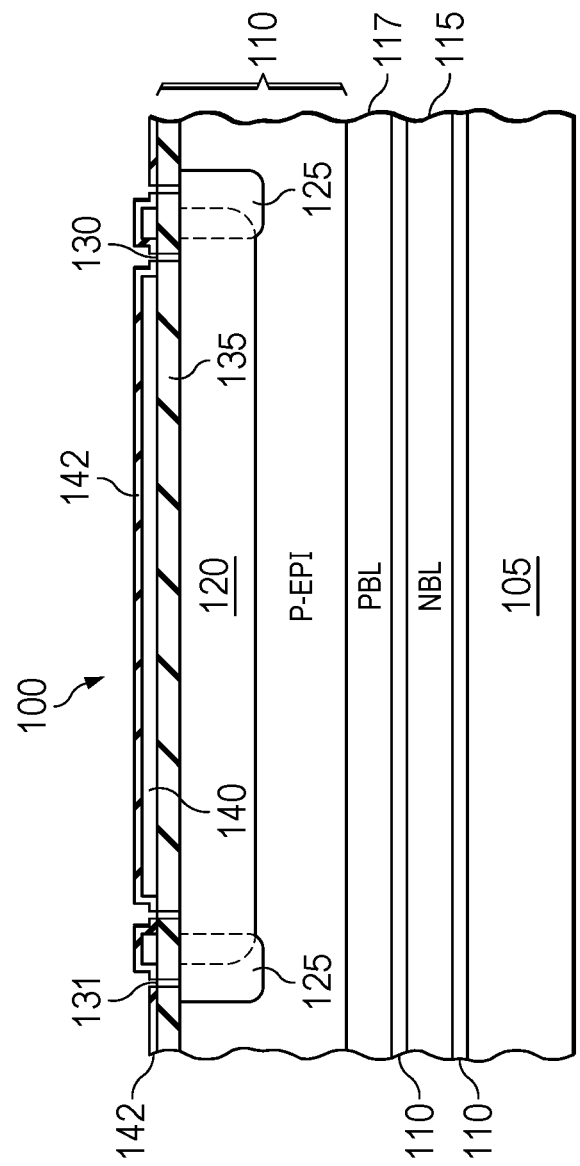

FIG. 4D shows the Hall sensor 100 after forming a polysilicon layer 410 over the STI layer 135. The polysilicon layer 410 is also shown over an MOS transistor 400 at an intermediate stage of formation. The transistor 400 includes a P-well 420 that may have been formed contemporaneously with the P-well 125. The transistor 400 may be a part of a circuit formed over the substrate 105 that implements functions related to the operation of the Hall sensor 100, such as the control circuit 700. The polysilicon layer 410 may be a blanket layer formed by furnace deposition, and may have a thickness of about 160 nm. Optionally the polysilicon layer 410 may be doped in situ or by ion implantation. FIG. 4E shows the Hall sensor 100 after forming the polysilicon layer 140 and the transistor 400 after forming a gate electrode 430, both formed by selective etch of the polysilicon layer 410. FIG. 4F shows the Hall sensor 100 after forming the dielectric layer 142. This layer may be formed by chemical vapor deposition, and may include nitrogen. The dielectric layer 142 may be or include silicon oxide, silicon nitride or silicon oxynitride. Portions of the dielectric layer 142 over the contacts 130 and 131 have been removed, e.g. by selective etch, and silicide regions, not shown, have been formed on the contacts 130 and 131, e.g. by conventional processing. Additional processing, not shown, that may be otherwise conventional, forms the metal interconnect layers and dielectric layers 145, 150, 155, 160 and 165 illustrated in FIG. 1B.

While various embodiments of the present disclosure have been described above, it should be understood that they have been presented by way of example only and not limitation. Numerous changes to the disclosed embodiments can be made in accordance with the disclosure herein without departing from the spirit or scope of the disclosure. Thus, the breadth and scope of the present invention should not be limited by any of the above described embodiments. Rather, the scope of the disclosure should be defined in accordance with the following claims and their equivalents.

The invention claimed is:

1. An electronic device, comprising:
   first and second doped regions both having a first conductivity type formed in a semiconductor substrate having a second conductivity type;
   a dielectric layer between the first and second doped regions and a surface plane of the semiconductor substrate;
   first, second, third and fourth terminals connected to the first doped region, the first and third terminals defining a first conductive path through the first doped region and the second and fourth terminals defining a second conductive path through the first doped region, the second conductive path intersecting the first conductive path;
   a first coil formed in an interconnect level over the first doped region, and a second coil formed in the interconnect level over the second doped region;
   a well region having the second conductivity type laterally between the first doped region and the semiconductor substrate and bounding a perimeter of the first doped region; and
   a control circuit configured to produce a current that when flowing produces:
      a first magnetic moment by the first coil, the first magnetic moment having a normal component with a first direction with respect to the surface plane; and
      a second magnetic moment by the second coil, the second magnetic moment having a normal component with a second opposite direction with respect to the surface plane.

2. The electronic device of claim 1, further comprising a polysilicon layer over the dielectric layer.

3. The electronic device of claim 2, further comprising a nitrogen-containing dielectric layer over the polysilicon layer.

4. The electronic device of claim 2, further comprising openings in the polysilicon layer, each terminal making a conductive connection to the first doped region through a corresponding one of the openings.

5. The electronic device of claim 1, wherein the first coil includes a spiral structure at each of a plurality of interconnect levels.

6. The electronic device of claim 2, further comprising a transistor extending into the semiconductor substrate, the transistor having a gate electrode formed from a same material layer as the polysilicon layer.

7. The electronic device of claim 2, wherein the polysilicon layer has a lateral boundary located over the well region.

8. The electronic device of claim 1, wherein the first conductivity type is N-type and the second conductivity type is P-type.

9. A method of forming an electronic device, comprising:
forming first and second doped regions having a first conductivity type in a semiconductor substrate having a second conductivity type;
forming a dielectric layer between the first and second doped regions and a surface plane of the semiconductor substrate;
forming first, second, third and fourth terminals connected to the first doped region, the first and third terminals defining a first conductive path through the first doped region and second and fourth terminals defining a second conductive path through the first doped region, the second conductive path intersecting the first conductive path;
forming a first coil formed in an interconnect level over the first doped region, and a second coil formed in the interconnect level over the second doped region;
forming a well region having the second conductivity type located laterally between the first doped region and the semiconductor substrate and bounding a perimeter of the first doped region; and
forming a control circuit configured to produce a current that causes a first magnetic moment by the first coil and a second magnetic moment by the second coil, the first magnetic moment having a normal component with a first direction with respect to the surface plane, and the second magnetic moment having a normal component with a second opposite direction with respect to the surface plane.

10. The method of claim 9, wherein the first coil includes a spiral structure at each of a plurality of interconnect levels.

11. The method of claim 9, wherein the first conductivity type is N-type and the second conductivity type is P-type.

12. The method of claim 9, further comprising forming a polysilicon layer over the dielectric layer.

13. The method of claim 12, further comprising a forming a nitrogen-containing dielectric layer over the polysilicon layer.

14. The method of claim 12, further comprising forming openings in the polysilicon layer, each terminal making a conductive connection to the first doped region through a corresponding one of the openings.

15. The method of claim 12, further comprising a forming a gate electrode of a transistor extending into the semiconductor substrate from a same material layer as the polysilicon layer.

16. The method of claim 12, wherein the polysilicon layer has a lateral boundary located over the well region.

17. An integrated circuit, comprising:
first and second doped regions both having a first conductivity type formed in a semiconductor substrate having a second conductivity type;
first, second, third and fourth terminals connected to the first doped region, the first and third terminals defining a first conductive path through the first doped region and the second and fourth terminals defining a second conductive path through the first doped region, the second conductive path intersecting the first conductive path;
fifth, sixth, seventh and eighth terminals connected to the second doped region, the fifth and seventh terminals defining a third conductive path through the second doped region and the sixth and eighth terminals defining a fourth conductive path through the second doped region, the fourth conductive path intersecting the third conductive path;
a first coil over the first doped region, and a second coil over the second doped region, the first coil configured to direct a current over the first doped region in a clockwise direction, and the second coil configured to direct the current over the second doped region in a counterclockwise direction; and
a shallow trench isolation layer between the first doped region and a surface plane of the semiconductor substrate.

18. The integrated circuit of claim 17, further comprising a current bus having a first current path configured to direct a current in a first direction and a second current path configured to direct the current in an opposite second direction, the first and second doped regions located between the first current path and the second current path.

19. The integrated circuit of claim 17, further comprising:
a third doped region having the first conductivity type formed in the semiconductor substrate;
a third coil over the third doped region, the third coil configured to direct the current over the third doped region in the clockwise direction; and
a control circuit configured to sense a first voltage across the first doped region in a first direction, and to sense a second across the second doped region in an orthogonal second direction.

20. An electronic device, comprising:
first and second doped regions both having a first conductivity type formed in a semiconductor substrate having a second conductivity type;
a dielectric layer between the first and second doped regions and a surface plane of the semiconductor substrate;
a polysilicon layer over the dielectric layer;
first, second, third and fourth terminals connected to the first doped region, the first and third terminals defining a first conductive path through the first doped region and the second and fourth terminals defining a second conductive path through the first doped region, the second conductive path intersecting the first conductive path;
a first coil formed in an interconnect level over the first doped region, and a second coil formed in the interconnect level over the second doped region;
openings in the polysilicon layer, each terminal making a conductive connection to the first doped region through a corresponding one of the openings; and
a control circuit configured to produce a current that when flowing produces:
a first magnetic moment by the first coil, the first magnetic moment having a normal component with a first direction with respect to the surface plane; and
a second magnetic moment by the second coil, the second magnetic moment having a normal component with a second opposite direction with respect to the surface plane.

21. An electronic device, comprising:
first and second doped regions both having a first conductivity type formed in a semiconductor substrate having a second conductivity type;
a dielectric layer between the first and second doped regions and a surface plane of the semiconductor substrate;

a polysilicon layer over the dielectric layer;
first, second, third and fourth terminals connected to the first doped region, the first and third terminals defining a first conductive path through the first doped region and the second and fourth terminals defining a second conductive path through the first doped region, the second conductive path intersecting the first conductive path;
a first coil formed in an interconnect level over the first doped region, and a second coil formed in the interconnect level over the second doped region;
a transistor formed extending into the semiconductor substrate, the transistor having a gate electrode formed from a same material layer as the polysilicon layer; and
a control circuit configured to produce a current that when flowing produces:
  a first magnetic moment by the first coil, the first magnetic moment having a normal component with a first direction with respect to the surface plane; and
  a second magnetic moment by the second coil, the second magnetic moment having a normal component with a second opposite direction with respect to the surface plane.

22. A method of forming an electronic device, comprising:
forming first and second doped regions having a first conductivity type in a semiconductor substrate having a second conductivity type;
forming a dielectric layer between the first and second doped regions and a surface plane of the semiconductor substrate;
forming a polysilicon layer over the dielectric layer;
forming first, second, third and fourth terminals connected to the first doped region, the first and third terminals defining a first conductive path through the first doped region and second and fourth terminals defining a second conductive path through the first doped region, the second conductive path intersecting the first conductive path;
forming a first coil formed in an interconnect level over the first doped region, and a second coil formed in the interconnect level over the second doped region;
forming openings in the polysilicon layer, each terminal making a conductive connection to the first doped region through a corresponding one of the openings; and
forming a control circuit configured to produce a current that causes a first magnetic moment by the first coil and a second magnetic moment by the second coil, the first magnetic moment having a normal component with a first direction with respect to the surface plane, and the second magnetic moment having a normal component with a second opposite direction with respect to the surface plane.

23. A method of forming an electronic device, comprising:
forming first and second doped regions having a first conductivity type in a semiconductor substrate having a second conductivity type;
forming a dielectric layer between the first and second doped regions and a surface plane of the semiconductor substrate;
forming a polysilicon layer over the dielectric layer;
forming first, second, third and fourth terminals connected to the first doped region, the first and third terminals defining a first conductive path through the first doped region and second and fourth terminals defining a second conductive path through the first doped region, the second conductive path intersecting the first conductive path;
forming a first coil formed in an interconnect level over the first doped region, and a second coil formed in the interconnect level over the second doped region;
forming a control circuit configured to produce a current that causes a first magnetic moment by the first coil and a second magnetic moment by the second coil, the first magnetic moment having a normal component with a first direction with respect to the surface plane, and the second magnetic moment having a normal component with a second opposite direction with respect to the surface plane; and
forming a gate electrode of a transistor, the transistor extending into the semiconductor substrate and the gate electrode formed from a same material layer as the polysilicon layer.

24. An integrated circuit, comprising:
first and second doped regions both having a first conductivity type formed in a semiconductor substrate having a second conductivity type;
first, second, third and fourth terminals connected to the first doped region, the first and third terminals defining a first conductive path through the first doped region and the second and fourth terminals defining a second conductive path through the first doped region, the second conductive path intersecting the first conductive path;
fifth, sixth, seventh and eighth terminals connected to the second doped region, the fifth and seventh terminals defining a third conductive path through the second doped region and the sixth and eighth terminals defining a fourth conductive path through the second doped region, the fourth conductive path intersecting the third conductive path;
a first coil over the first doped region, and a second coil over the second doped region, the first coil configured to direct a current over the first doped region in a clockwise direction, and the second coil configured to direct the current over the second doped region in a counterclockwise direction; and
a current bus having a first current path configured to direct a current in a first direction and a second current path configured to direct the current in an opposite second direction, the first and second doped regions located between the first current path and the second current path.

25. An integrated circuit, comprising:
first and second doped regions both having a first conductivity type formed in a semiconductor substrate having a second conductivity type;
first, second, third and fourth terminals connected to the first doped region, the first and third terminals defining a first conductive path through the first doped region and the second and fourth terminals defining a second conductive path through the first doped region, the second conductive path intersecting the first conductive path;
fifth, sixth, seventh and eighth terminals connected to the second doped region, the fifth and seventh terminals defining a third conductive path through the second doped region and the sixth and eighth terminals defining a fourth conductive path through the second doped region, the fourth conductive path intersecting the third conductive path;

a first coil over the first doped region, and a second coil over the second doped region, the first coil configured to direct a current over the first doped region in a clockwise direction, and the second coil configured to direct the current over the second doped region in a counterclockwise direction;

a third doped region having the first conductivity type formed in the semiconductor substrate;

a third coil over the third doped region, the third coil configured to direct the current over the third doped region in the clockwise direction; and a control circuit configured to sense a first voltage across the first doped region in a first direction, and to sense a second across the second doped region in an orthogonal second direction.

* * * * *